(12) United States Patent
Harter et al.

(10) Patent No.: US 7,615,807 B2
(45) Date of Patent: Nov. 10, 2009

(54) FIELD-EFFECT TRANSISTOR STRUCTURES WITH GATE ELECTRODES WITH A METAL LAYER

(75) Inventors: Johann Harter, Dresden (DE); Thomas Schuster, Dresden (DE)

(73) Assignee: Infineon Technologies AG, Munich (DE)

( * ) Notice: Subject to any disclaimer, the term of this patent is extended or adjusted under 35 U.S.C. 154(b) by 237 days.

(21) Appl. No.: 11/849,727

(22) Filed: Sep. 4, 2007

(65) Prior Publication Data

US 2007/0296042 A1 Dec. 27, 2007

Related U.S. Application Data

(63) Continuation of application No. 11/167,510, filed on Jun. 27, 2005, now Pat. No. 7,265,007.

(30) Foreign Application Priority Data

Jun. 30, 2004 (DE) .................... 10 2004 031 741

(51) Int. Cl.
*H01L 21/336* (2006.01)
(52) U.S. Cl. ................ 257/213; 257/413; 257/E21.158
(58) Field of Classification Search ................ 257/213, 257/412, 413, 530
See application file for complete search history.

(56) References Cited

U.S. PATENT DOCUMENTS

| 5,966,597 | A | 10/1999 | Wright |
| 6,198,144 | B1 | 3/2001 | Pan et al. |
| 6,207,543 | B1 | 3/2001 | Harvey et al. |
| 6,335,254 | B1 | 1/2002 | Trivedi |
| 6,383,882 | B1 * | 5/2002 | Lee et al. ..................... 438/303 |
| 7,012,000 | B2 * | 3/2006 | Hong ......................... 438/211 |

FOREIGN PATENT DOCUMENTS

WO 2004010507 1/2004

* cited by examiner

*Primary Examiner*—Roy K Potter
(74) *Attorney, Agent, or Firm*—Dicke, Billig & Czaja, PLLC

(57) ABSTRACT

Provided is an integrated circuit including a transistor with a gate electrode. The gate electrode includes a polysilicon layer in contact with a gate dielectric layer separating the gate electrode and a semiconductor substrate that comprises an active region of the transistor. The gate electrode includes sidewall structures extending along lower portions of opposing sidewalls of the polysilicon layer, the lower portion being oriented to the semiconductor substrate. The gate electrode also includes a barrier layer. A first section of the barrier layer extends along an upper portion of the sidewall of the polysilicon layer, the upper portion being adjacent to the lower portion and facing away from the semiconductor substrate.

20 Claims, 14 Drawing Sheets

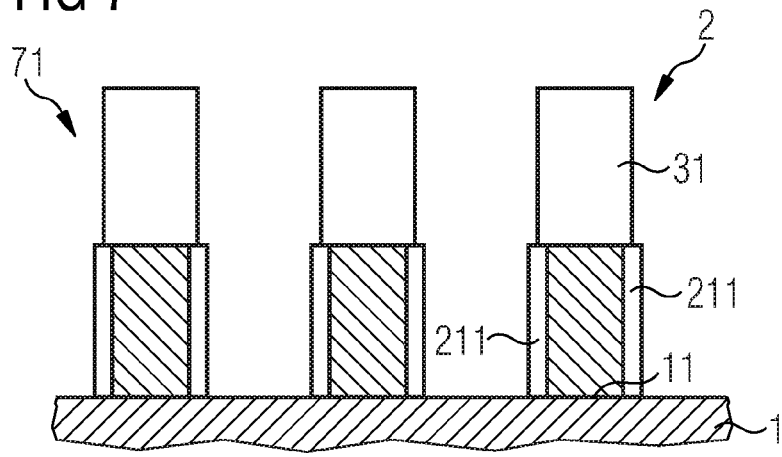
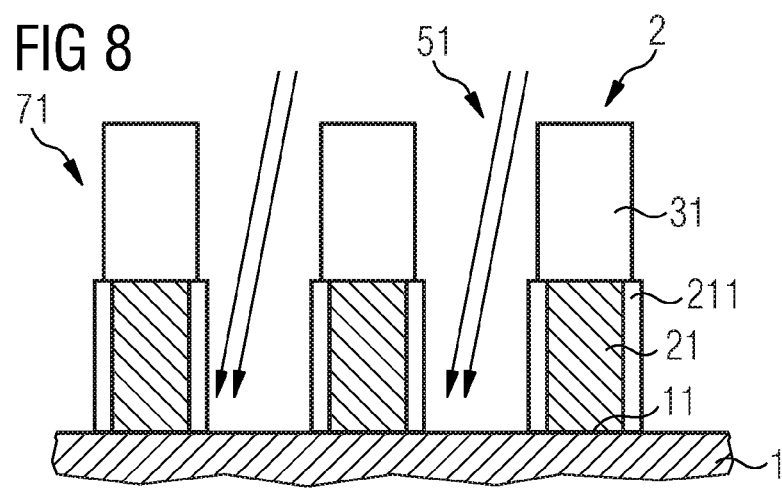
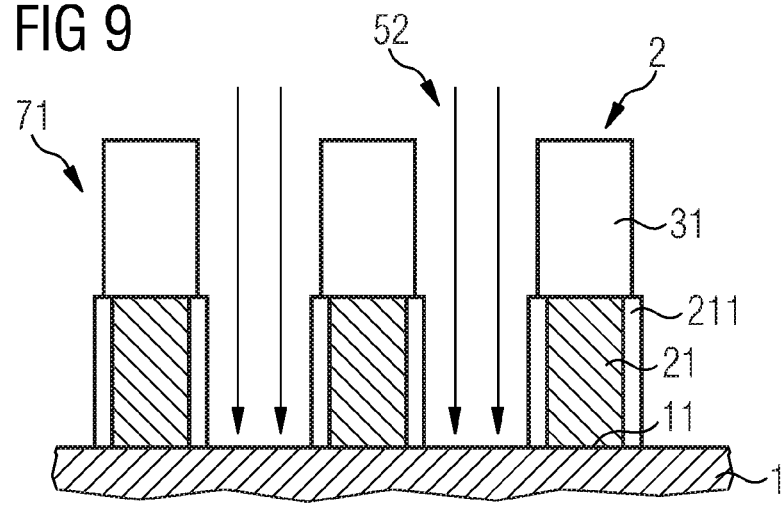

FIELD-EFFECT TRANSISTOR STRUCTURES WITH GATE ELECTRODES WITH A METAL LAYER

CROSS-REFERENCE TO RELATED APPLICATIONS

This patent application is a continuation of application Ser No. 11/167,510, filed on Jun. 27, 2005, now U.S. Pat. No. 7.265,007 which claims priority to German Patent Application No. DE 10 2004 031 741.0, filed on Jun. 30, 2004, both of which are incorporated herein by reference.

BACKGROUND

One embodiment of the invention relates to a method for fabricating field-effect transistor structures with gate electrode structures each having a metal layer.

Integrated circuits include field-effect transistor structures each having an active area and a gate electrode. The active area comprises a source region, a drain region and a channel region between the source and drain regions. The source region and the drain region are formed in a semiconductor substrate as doped regions of a first conductivity type in each case below a process surface of the semiconductor substrate. The channel region is in the form of an undoped region or a doped region of a second conductivity type which is opposite to the first conductivity type. The gate electrodes of the field-effect transistor structures are in each case provided above the channel region on a gate dielectric resting on the process surface of the semiconductor substrate.

When the field-effect transistor structure is operating, the formation of a conductive channel in the channel region between the source region and the drain region is controlled by a potential at the gate electrode.

To form the gate electrodes of the field-effect transistors, first of all a sequence of layers of a gate electrode layer stack is deposited on the gate dielectric layer, and then the gate electrode layer stack is patterned by means of a photolithographic process.

In memory cell arrays, the gate electrodes of a plurality of select transistors of the memory cells form integral components of word lines for addressing the memory cells in the memory cell array. Since the access times of the memory cells depend on the conductivity of the word lines, it is aimed to use materials with a low resistivity to form the gate electrodes.

It is customary, for example, to provide tungsten for a metal layer in the gate electrode layer stack. Metal atoms which diffuse out of the respective metal layer act as impurities in adjacent structures which do not contain metal, having an adverse effect, for example, on the insulator properties of these structures. Therefore, at least in the direction of the gate dielectric, a barrier layer preventing metal atoms from diffusing into adjacent structures is provided as a sublayer, of the metal layer. For functional reasons, a polysilicon layer is used in the vicinity in the gate dielectric.

U.S. Pat. No. 6,198,144 has disclosed a gate electrode structure that includes an polysilicon layer resting on the gate dielectric, an electrically conductive barrier layer on the polysilicon layer and a metal layer on the barrier layer. The metal of the metal layer is tungsten. The barrier layer is formed from tungsten nitride. A silicon dioxide layer as an insulating cap layer rests on the metal layer. The vertical side walls of the gate electrode structures are each covered by a silicon nitride coating.

One significant aspect in the processing of gate electrode structures or gate stacks is the height of the gate electrode structure (stack height). The general aim is to reduce the stack height, since as the aspect ratio of the gate electrode structures and of the trenches between the gate electrode structures rises, various processes involved in forming field-effect transistors become more difficult. This is true in particular of the etching involved in opening a mask in order to pattern the gate electrode layer stack, the etching of the gate electrode layer stack itself, the filling of trenches between the gate electrode layer stacks, the etching of the fillings for contact-connection of the source or drain regions of the field-effect transistors, the deposition of a barrier layer for metallic contact structures in the trenches and the deposition of metal for forming the contact structures.

The source and drain regions are formed by implantation with masking by the gate stacks. To improve the functionality of the select transistors as memory cells, it is known to use an oblique implantation to form doped regions which are asymmetric and/or considerably undercut the gate stacks. As the height of the gate stacks increases, the possible range for an implantation angle at which the oblique implantation is carried out becomes narrower.

Reducing the thickness of the metal layer leads to an increase in the resistance of the word line. The proportion of the total height of the gate stack that is formed by the barrier layers is relatively small. For process engineering reasons, the thickness of the polysilicon layer is substantially dependent on the standard patterning of the gate electrode layer stack.

In general, the etching of the gate electrode layer stack is carried out in at least two etching steps, with the first etching step acting on the metal-containing layers and the second etching step acting on the polysilicon layer.

To ensure the complete removal of the metal-containing layers outside the gate stack structure, the metal-containing layers are overetched; a correspondingly high thickness of the polysilicon layer ensures that the etching step is guaranteed to end in the region of the polysilicon layer. Furthermore, the metal-containing layers are generally covered with a nitride liner prior to the etching of the polysilicon layer. Further overetching into the polysilicon layer, resulting in the need for an additional reserve in the layer thickness of the polysilicon layer, is required to reliably open up the nitride liner above the polysilicon.

Therefore, the polysilicon layer is generally provided in a significantly greater layer thickness than its electrical functionality in the finished field-effect transistor structure required. The etching processes required for patterning of the gate electrode layer stack are relatively complex and lead to the processing of structures with a high aspect ratio.

SUMMARY

One embodiment provides an integrated circuit including a transistor with a gate electrode. The gate electrode includes a polysilicon layer in contact with a gate dielectric layer separating the gate electrode and a semiconductor substrate that comprises an active region of the transistor. The gate electrode includes sidewall structures extending along lower portions of opposing sidewalls of the polysilicon layer, the lower portion being oriented to the semiconductor substrate. The gate electrode also includes a barrier layer. A first section of the barrier layer extends along an upper portion of the sidewall of the polysilicon layer, the upper portion being adjacent to the lower portion and facing away from the semiconductor substrate.

BRIEF DESCRIPTION OF THE DRAWINGS

FIGS. 1-33 are cross sections through gate structures illustrated in various stages of the processing in accordance with an exemplary embodiment of a method according to one embodiment of the invention for fabricating gate electrode structures each having a metal layer.

DETAILED DESCRIPTION

Figure 1:
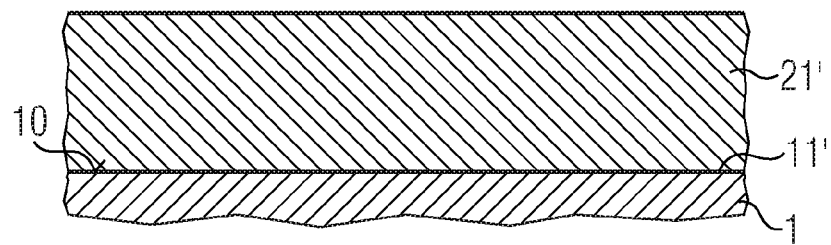

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention is a method for fabricating gate electrode structures for field-effect transistor structures in which a plurality of process steps act on structures with an aspect ratio that is reduced compared to conventional methods. In one embodiment, the processing of the gate electrode structures is simplified and the yield of components produced without any faults is increased.

According to one embodiment of the invention, first of all a polysilicon layer of a gate conductor layer stack is patterned, and only subsequently is a gate metal of the gate electrode layer stack patterned in self-aligned fashion with respect to the polysilicon layer which has already been patterned.

According to one embodiment of the method of the invention for fabricating gate electrode structures with an individual gate metal layer, first of all a polysilicon layer is applied to a process surface of a semiconductor substrate covered with a gate dielectric layer. The polysilicon layer is patterned by a photolithographic process, with in each case an individual polysilicon layer of a gate structure being formed from the polysilicon layer. The gate structures initially each comprise only an individual polysilicon layer. The trenches that have been formed from the patterning between the gate structures are filled with a filling material. Fillings which fill the trenches up to the top edge of the individual polysilicon layers are formed from the filling material. The individual polysilicon layers are caused to recede to below the top edge of the fillings. The spaces formed between the fillings above the individual polysilicon layers that have been caused to recede are at least partially filled with a metal, which in each of the spaces forms an individual gate metal layer of the respective gate structure.

In one case a gate metal is applied to fill the spaces and for this gate metal to be caused to recede to below the top edge of the fillings. The gate metal layers of the respective gate structures are formed from the gate metal. The step of causing the gate metal to recede in one case includes a planarization step, for example a chemical mechanical polishing (CMP) step and a subsequent etching process which is selective with respect to the fillings.

Unlike in conventional methods, the patterning of the gate metal layers in accordance with one embodiment of the invention results not from a photolithographic process with a mask layer positioned above the gate metal, but rather from the relief-like patterning of the underside of the gate metal which has been deposited by the fillings formed from the photolithographic patterning of the polysilicon layer.

The elimination of the gate metal from the photolithographic patterning process significantly reduces the demands imposed on a starting layer thickness of a mask layer for patterning of the gate electrodes. The aspect ratios both with regard to the etching of the mask layer and with regard to the etching of the gate electrode layer stack itself are in each case significantly reduced.

Reducing the height of the gate structure at the time of the filling of the trenches between the gate structures significantly mitigates the process conditions for the deposition of the filling material. The demands imposed for defect-free filling of the trenches are reduced.

The removal of the polysilicon outside the gate structures is simplified, and consequently the surface etching of the semiconductor substrate in the region of the trenches (pitting) is alleviated.

To fill the trenches in one case, first a filling material is deposited and then this filling material is caused to recede in planar fashion at least down to the top edge of the individual polysilicon layer by means of a CMP process. The fillings are formed from the filling material between the gate structures. The individual polysilicon layers are uncovered. After the gate metal has been caused to recede to below the top edge of the fillings, a dielectric gate cap layer is applied and caused to recede in planar fashion at least down to the top edge of the fillings. In each case a gate cap of the respective gate structure is formed from the gate cap layer. The gate structures then each comprise an individual polysilicon layer, an individual gate metal layer resting on the polysilicon layer and a gate cap resting on the metal layer, and each correspond to a gate electrode structure.

The method according to one embodiment of the invention for fabricating gate electrode structures can be linked with the forming of contact structures for the electrical connection of conductive structures formed in the semiconductor substrate.

In this way, a gate sacrificial layer is applied to the polysilicon layer prior to the patterning of the polysilicon layer. The gate sacrificial layer is then patterned together with the polysilicon layer during the same photolithographic step.

After the trenches have been filled and the individual polysilicon layers have been caused to recede, a BC photoresist layer is applied to the planar structure surface which in sections is formed by the filling material of the fillings and in sections is formed by the material of the gate sacrificial layer. The BC photoresist layer is opened up above sections of the fillings which are intended to form contact structures, by means of a photolithographic process. Below the openings in the BC photoresist layer, the fillings are removed in sections, so that the semiconductor substrate is uncovered in sections.

Subsequently, a contact metal is deposited and then caused to recede to below the top edge of the individual polysilicon layers. The operation of causing the contact metal to recede in one case includes as a first step a CMP process which ends at the top edge of the gate sacrificial layer. In a second step, the operation of causing the contact metal to recede comprises an etching process which acts selectively with respect to the filling material and the material of the gate sacrificial layer. A plurality of contact structures are formed from the contact metal between the gate structures.

A contact sacrificial layer is applied to the surface which is formed in sections by the filling material, the material of the gate sacrificial layer and the contact metal. The contact sacrificial layer and the gate sacrificial layer are formed from the same material or from materials with similar properties with respect to at least a CMP process. The contact sacrificial layer is then planarized and, together with the residual sections of the gate sacrificial layer, removed at least down to the top edge of the individual polysilicon layers. This uncovers the individual polysilicon layers. The contact structures remain covered by residual sections of the contact sacrificial layer.

Then, in the manner which has already been described above, the individual polysilicon layers are caused to recede to below the top edge of the fillings and the gate metal layers are provided; the residual sections of the contact sacrificial layer are removed, and the contact structures uncovered, during the subsequent operation of causing the gate cap layer to recede in planar fashion.

Defect-free deposition of the contact metal in the trenches between the gate structures is simplified compared to conventional methods, on account of the reduced depth of these trenches.

The method according to one embodiment of the invention for fabricating gate electrode structures accordingly leads to a method for forming field-effect transistor arrangements with gate electrode structures and contact structures each having a metal layer.

A semiconductor substrate covered with a gate dielectric layer is first of all provided for this purpose. A polysilicon layer is applied to the gate dielectric layer, and a gate sacrificial layer is applied to the polysilicon layer. The gate sacrificial layer and the polysilicon layer are patterned during the same photolithographic process, with gate structures in each case having an individual polysilicon layer covered by a residual section of the gate sacrificial layer being formed from the polysilicon layer and the gate sacrificial layer.

A filling material is deposited, filling trenches between the gate structures. The filling material is planarized and in the process caused to recede at least down to the top edge of the individual polysilicon layer. The filling material forms fillings between the gate structures. The individual polysilicon layers are uncovered.

A BC photoresist layer is applied and patterned photolithographically. The BC photoresist layer is opened up over sections of the fillings intended to form contact structures. The filling material is removed below the openings in the BC photoresist layer, with contact openings being formed between the gate structures and the semiconductor substrate being uncovered in the region of the contact openings.

A contact metal is applied and the contact openings are filled with the contact metal. In a first step, the contact metal is caused to recede down to the top edge of the residual sections of the gate sacrificial layer. In a second step, the contact metal is caused to recede, selectively with respect to the material of the gate sacrificial layer, to below the top edge of the individual polysilicon layers, with the contact structures with a top edge below the top edge of the individual polysilicon layers being formed from the contact metal in the contact openings.

A contact sacrificial layer is applied. This fills the spaces between the gate structures above the contact structures. The contact sacrificial layer is planarized together with the residual sections of the gate sacrificial layer. The planarization is controlled in such a way that the residual sections of the gate sacrificial layer are completely removed and the individual polysilicon layers are uncovered, while on the other hand the contact structures remain covered by residual sections of the contact sacrificial layer.

As a result, the contact structures have been completely formed and are protected from the subsequent, final processing of the gate electrode structures by the residual sections of the contact sacrificial layer.

The processing of the gate structures is continued by causing the individual polysilicon layers to recede to below the top edge of the fillings or of the residual sections of the contact sacrificial layer.

A gate metal is applied and caused to recede. In a first step, the gate metal is removed in planar fashion by a CMP process down to the top edge of the fillings or of the residual sections of the contact sacrificial layer. In a second step, the gate metal in the region of the gate structures is caused to recede selectively with respect to the material of the fillings or of the contact sacrificial layer. The gate metal which has been caused to recede in each case forms an individual gate metal layer in the respective gate structures.

A dielectric cap layer is applied and, together with the residual sections of the contact sacrificial layer, caused to recede at least down to the top edge of the contact structures. A dielectric gate cap is formed from the gate cap layer in each of the gate structures. The residual sections of the contact sacrificial layer are completely removed. The corresponding gate electrode structures have been formed from the gate structures.

The method according to one embodiment of the invention allows the provision of metals or metal compounds both within the gate electrode structures and within the contact structures without this requiring patterning of a metal layer by photolithographic means with an etching mask on top.

Since the patterning of the individual polysilicon layer only requires a combined etch together with the gate sacrificial layer on top, the fluctuations in the gate width are lower than in conventional methods.

Polishing processes acting on metal-containing layers stop at polishing stop levels formed in sections from silicon nitride layers.

In one case, the fillings are caused to recede approximately down to the top edge of the contact structures prior to the application of the contact sacrificial layer.

This means that during the processing of the gate metal, the fillings are covered by residual sections of the contact sacrificial layer in the same way as the contact structures. The planarization step involved in causing the deposited gate metal to recede is simplified, since the CMP process stops at the same material between the gate structures.

The application of the gate metal may includes the application of a plurality of sublayers of different materials. In one case the gate metal is provided with at least one lower sublayer of a first barrier metal and an upper sublayer of a first metal or a first metal compound. The barrier material is selected in such a way that outdiffusion of metal out of the upper sublayer toward the individual polysilicon layers is suppressed.

In the same or a similar way, the application of the contact metal may include the application of a plurality of sublayers. In this case, a lower sublayer of a second barrier material and an upper sublayer of a second metal or a second metal compound are provided. The second metal or the second metal compound may be identical to the first metal or the first metal compound. The second barrier material may be identical to the first barrier material. It is also possible to provide for the application of further sublayers in order to improve the contact resistance between the individual polysilicon layer and the metal layer.

One embodiment of the method according to the invention results in conjunction with side wall oxidation at vertical side walls of the individual polysilicon layers, which is carried out in conjunction with one embodiment of the method according to the invention. The side wall oxidation is carried out after the patterning of the polysilicon layer, with side wall oxide structures in each case being produced at the vertical side walls of the individual polysilicon layers. Whereas in conventional methods the gate metal layer has already been provided at the time of the side wall oxidation and has a disadvantageous effect, for example, on the gate metal and the gate barrier material, according to one embodiment of the invention there is no need for the gate metal and the gate barrier material to be protected against oxidation, which generally requires a selective wet-etch process for the barrier layer and metal layer and a subsequent protective coating of the uncovered barrier and metal layers, prior to the side wall oxidation.

To better protect the gate metal or the gate barrier materials from oxidation, the side wall oxide structures are in one case caused to recede to below the top edge of the individual polysilicon layers after the latter have been caused to recede, and the notches which are formed between the fillings and the individual polysilicon layers are filled with the material of the first barrier layer.

According to another embodiment of the method according to the invention, nitride spacers of silicon nitride are provided at the vertical side walls of the gate structures following the patterning of the polysilicon layer or following the formation of the side wall oxide structures.

In subsequent selective etching processes, the gate structures outwardly act as one material. This simplifies control of the etching processes. For example, when etching the filling material to define the contact openings, the filling material can be etched selectively with respect to silicon nitride. On the other hand, the nitride spacers encapsulate the contact structures and the fillings during processing of gate structures arranged between them involving causing the polysilicon and the side wall oxide to recede.

In one method according to the invention, doped regions are formed in the semiconductor substrate by implantation between the patterning of the polysilicon layer and the filling of the trenches with the filling material. Since at this time the height of the gate structures is relatively low, the angle at which an oblique implantation for forming sections of the doped regions on just one side or which strongly undercut the gate structures can be carried out, is subject to fewer restrictions.

The method according to one embodiment of the invention leads to one method for fabricating field-effect transistor arrangements in a cell array and a support region of a semiconductor substrate. The gate electrode structures of the field-effect transistors are provided in a high packing density in the cell array and in a low packing density in the support region. In the cell array, conductive regions are formed between the gate electrode structures in the semiconductor substrate beneath the gate electrode structures, and these conductive regions are contact-connected by means of bit contact structures formed between the gate electrode structures. In the support region, support contacts, which connect the conductive regions in the semiconductor substrate to connection lines provided above the gate electrode structures, are formed between the gate electrode structures.

According to one embodiment of the invention, now both the bit contact structures and the support contacts, in accordance with the contact structures, are formed by the method described above. The BC photoresist layer is opened up above sections of the fillings or of the filling material which are intended to form the bit contact structures and the support contacts. Both the bit contact structures and the support contacts are produced during the operations of depositing the contact metal layer and causing it to recede.

One embodiment of the invention eliminates a complete lithographic patterning sequence compared to the successive patterning of the support contacts and of the bit contact structures which is customary in conventional methods.

In one case the gate caps of the gate electrode structures in the support region then are opened up by means of a photolithographic mask and for the gate caps to be caused to recede in the uncovered sections.

The implantation operations involved in forming the doped regions in the support region are in one case carried out following the patterning of the polysilicon layer.

A gate electrode arrangement, including gate electrode structures each with an individual gate metal layer, having a plurality of gate structures, contact structures arranged between the gate structures and also fillings arranged between the gate structures, is formed by the method according to one embodiment of the invention.

The gate structures are provided with an individual polysilicon layer resting on a gate dielectric, an individual gate barrier layer, which rests on the individual polysilicon layer and suppresses diffusion of metal out of the gate metal layer, and a further sublayer of a gate metal layer resting on the individual gate barrier layer. Furthermore, side wall oxide structures are provided at vertical side walls of the individual polysilicon layer. A dielectric gate cap rests on the gate metal layer. The vertical side walls of the gate structure including the side wall oxide structures are covered by nitride spacers. The contact structures each comprise an individual contact barrier layer resting on the semiconductor substrate and a contact metal layer resting on the contact barrier layer. The fillings are formed from a doped silicate glass.

According to the exemplary embodiment, a gate dielectric layer 11' is provided in an initially known way on a process surface 10 of a semiconductor substrate 1. A polysilicon layer 21' is deposited on the gate dielectric layer 11'. The polysilicon layer 21' is provided with a greater layer thickness than the functionality of the finished gate electrode structure 2 requires. As the method continues, the polysilicon layer 21' is caused to recede after the contact structures 4, 82 have been formed and before a gate metal 25' is deposited.

A silicon nitride layer is deposited on the polysilicon layer 21'.

Figure 2:
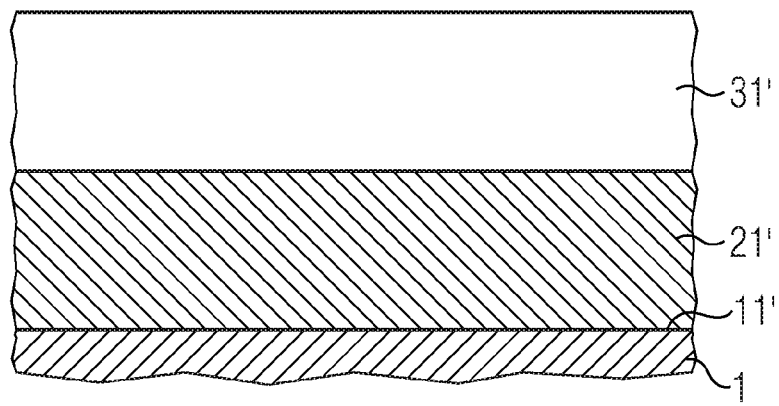

The silicon nitride layer illustrated in FIG. 2 forms a gate sacrificial layer 31', which as the processing continues is completely removed again after the contact structures 4, 82 have been formed and before the gate metal 25' is applied, and which during the processing of the contact structures, 4, 82 covers the underlying sections of the polysilicon layer 21'.

The gate sacrificial layer 31' is coated with a GC antireflection coating 32'. A GC photoresist layer 33 is applied and photolithographically patterned.

Figure 3:
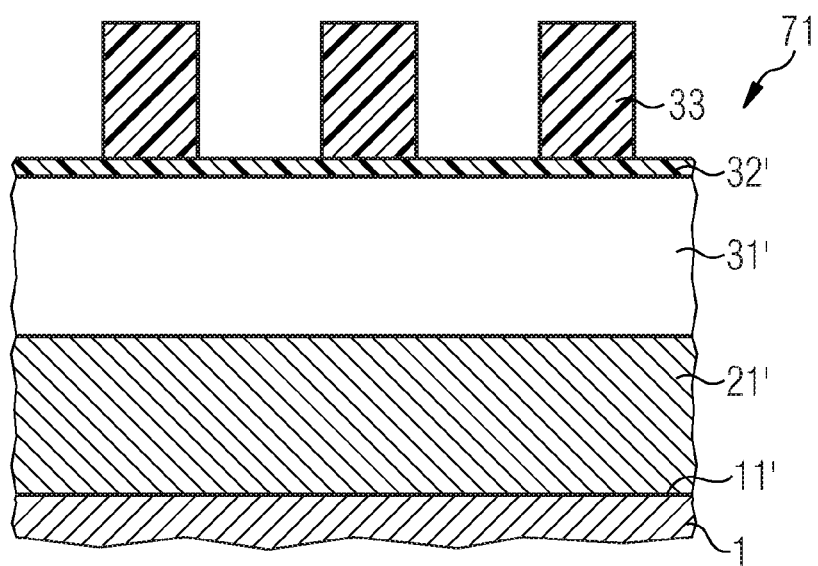

FIG. 3 illustrates the patterned GC photoresist layer 33 corresponding to the gate electrode structures 2 in a cell array 71.

Figure 4:
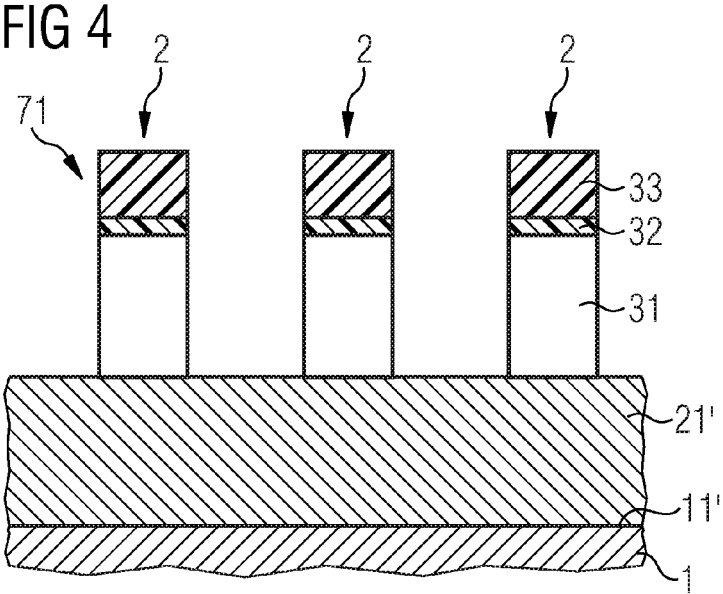

In accordance with FIG. 4, the pattern of the GC photoresist layer 33 is transferred into the gate sacrificial layer 31', which subsequently serves initially as a hard mask for patterning of the polysilicon layer 21'.

Figure 5:
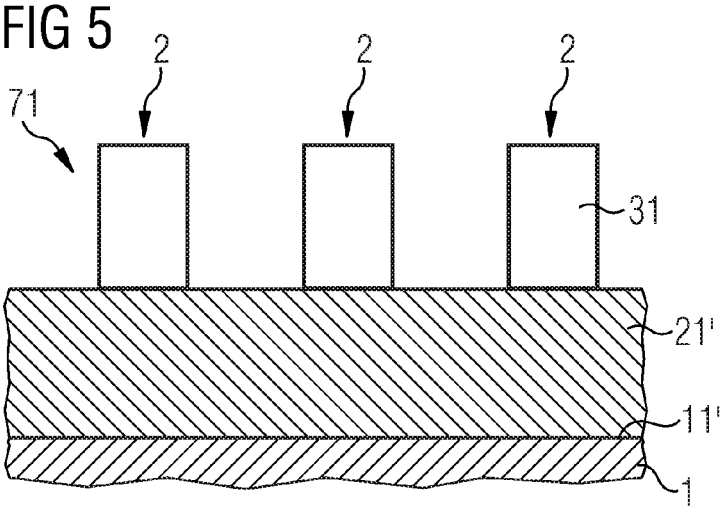

FIG. 5 illustrates the hard mask 31 formed from residual sections of the patterned gate sacrificial layer in the cell array 71 following the removal of residual sections of the GC antireflection coating 32' and of the GC photoresist layer 33. The pattern of the hard mask 31 is transferred to the polysilicon layer 21 by an anisotropic etching step.

Figure 6:
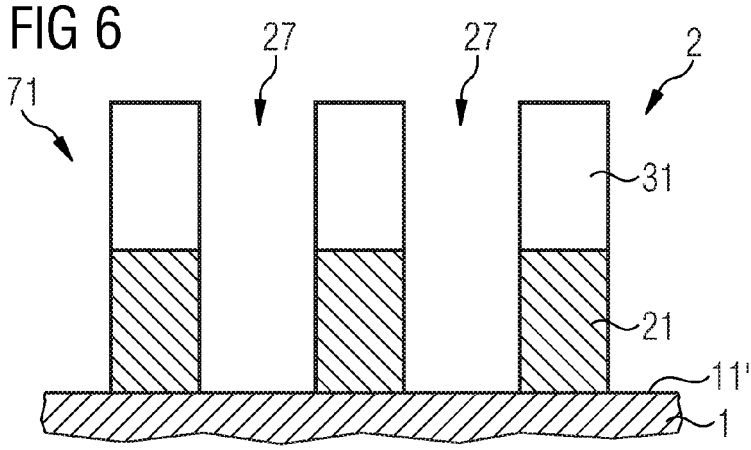

In accordance with FIG. 6, a plurality of gate structures 2 have been formed in the cell array 71 from the gate sacrificial layer 31' and the polysilicon layer 21', and trenches 27 have been formed between the gate structures 2. The gate structures 2 each include an individual polysilicon layer 21 and a residual section of the gate sacrificial layer 31' as individual gate sacrificial layer 31. Beneath each of the individual polysilicon layers 21 there is a gate dielectric 11 formed from a gate dielectric layer 11'.

An oxidation process which acts on the polysilicon of the individual polysilicon layers 21 is controlled, so as to form side wall oxide structures 211 along the vertical side walls of the individual polysilicon layers 21 of the gate structures 2, as illustrated in FIG. 7. A support region 72 located outside the cell array 71 is covered, and an XB oblique implantation 51 in the cell array 71 is controlled in order to form implantation regions on one side or implantation regions which strongly undercut the adjacent gate structures 2 on both sides, in accordance with FIG. 8.

Figure 10:
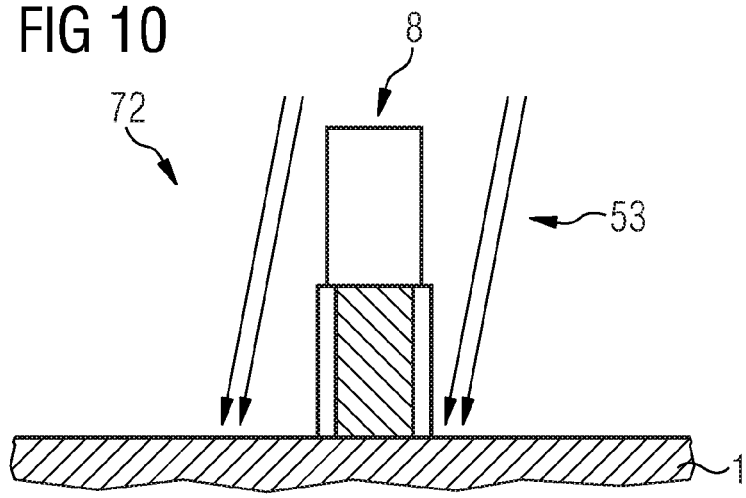
Figure 11:
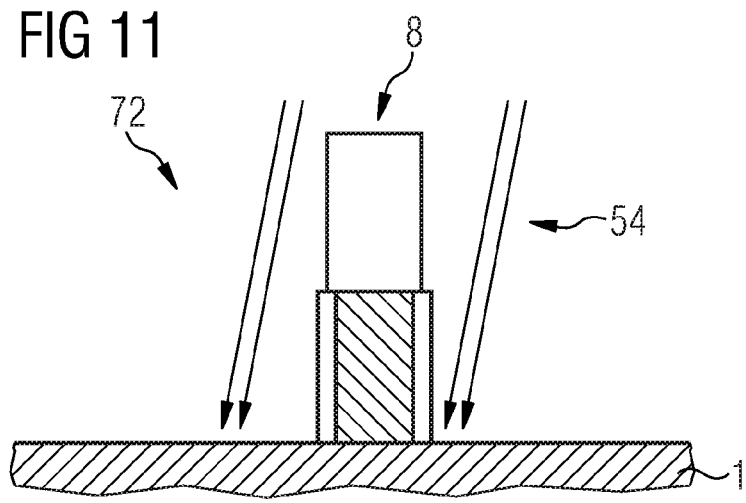

After removal of the temporary covering of the support region 72, an unmasked XA1 implantation 52 is carried out in accordance with FIG. 9. There in each case follow further XN/XP implantations 53, 54 in order to form n-channel FETs and p-channel FETs in the support region 72; during the respective implantation steps, the cell array 71 and the sections in each case assigned to the other transistor type are covered by a photolithographically patterned resist layer. The implantation steps are illustrated in FIGS. 10 and 11 in connection with support gate stacks 8 formed in the support region 72 in a corresponding way to the gate structures 2.

Figure 12:
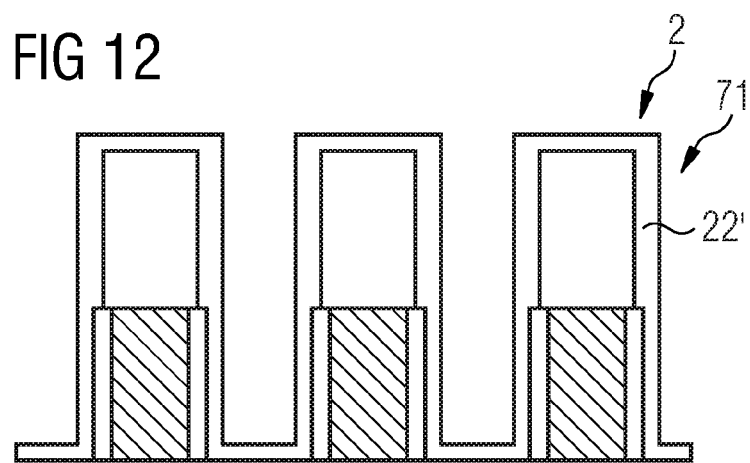

In accordance with FIG. 12, a silicon nitride layer 22' is deposited on the relief formed by the gate structures 2 and support gate stacks 8 on the semiconductor substrate 1, and this silicon nitride layer 22' is then caused to recede, for example by an anisotropic etch, to form nitride spacers 22.

Figure 13:
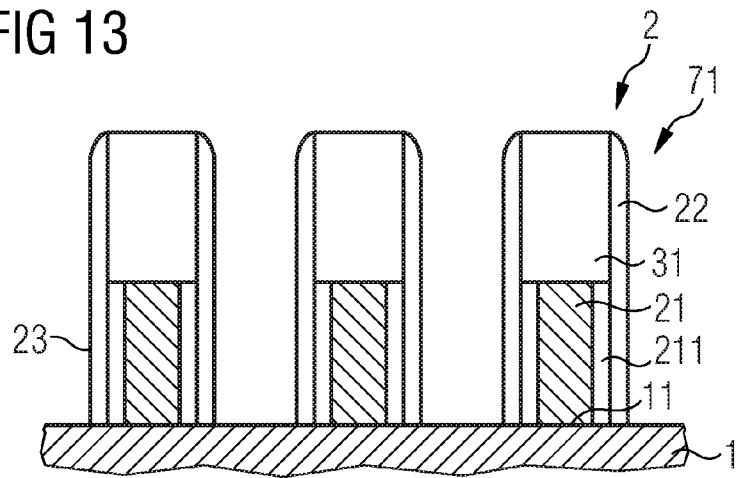

FIG. 13 illustrates the gate structures 2 in the cell array 71 after the nitride spacers 22 have been formed. The gate structures 2 here in each case include an individual polysilicon layer 21 with side wall oxide structures 211 formed at their vertical side faces. An individual gate sacrificial layer 31 rests on the individual polysilicon layer 21. The vertical side walls of the structures formed by the individual gate sacrificial layer 31, the individual polysilicon layer 21 and the side wall oxide structures 211 are covered by the nitride spacers 22. The gate structures 2 are separated from the semiconductor substrate 1 below by the gate dielectric 11.

Figure 14:
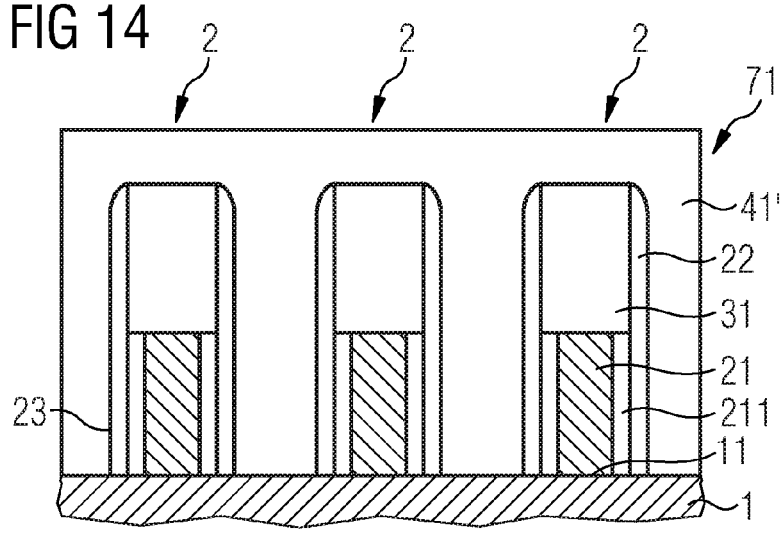
Figure 15:
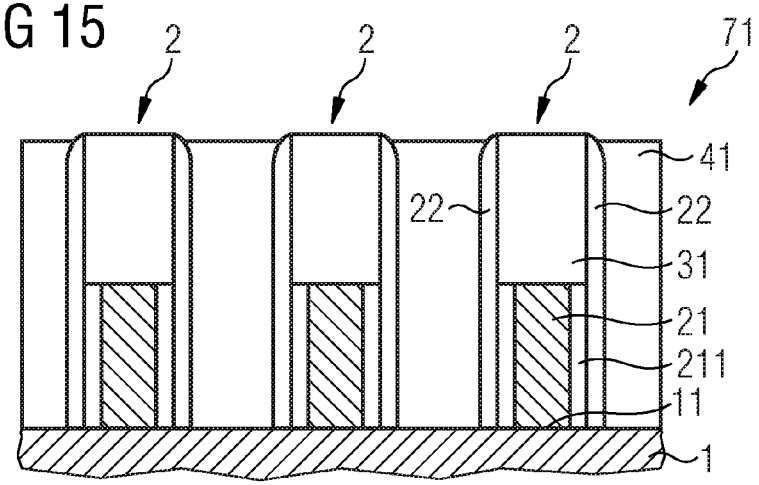

Subsequently, a thin nitride liner 23 is applied and the relief is filled with borophosphosilicate glass BPSG as filling material 41', as illustrated in FIG. 14. The filling material 41' above the top edge of the individual gate sacrificial layers 31 is removed in a CMP process. The CMP process ends at the top edge of the individual gate sacrificial layers 31. Between the gate structures 2, the filling material 41' forms fillings 41 in accordance with the illustration presented in FIG. 15.

Figure 16:
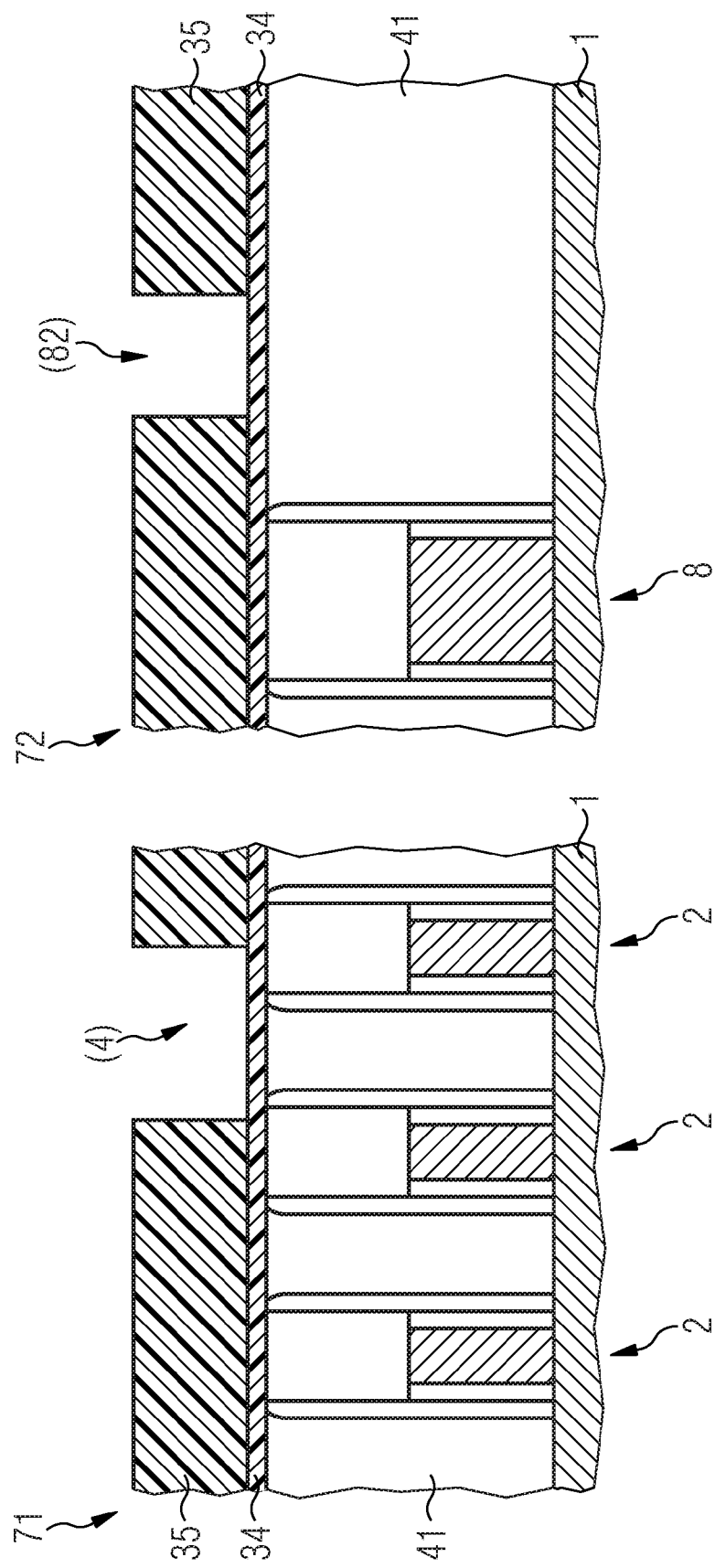

During a further photolithographic process, which is outlined in FIG. 16, a BC antireflection coating 34 and a BC photoresist layer 35 are applied and photolithographically patterned, with the BC photoresist layer 35 being opened up in the region of bit contact structures 4 in the cell array 71 and in the region of contact structures 82 in the support region 72.

FIG. 16 illustrates the opened BC photoresist layer 35 with the openings (4), (82) corresponding to the contact structures 4, 82 which are to be formed.

Figure 17:
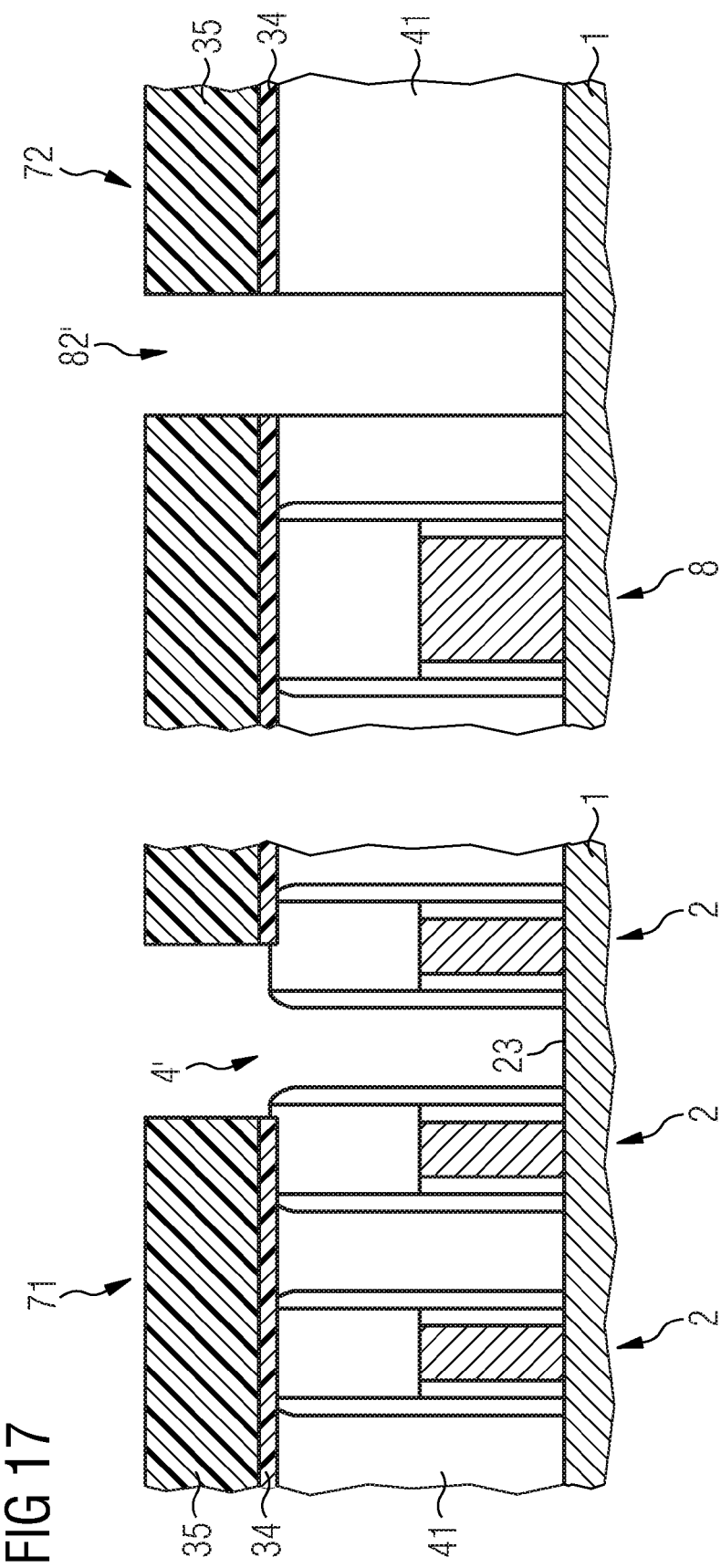

The BC antireflection coating 34 is opened up, and beneath the openings (4), (82), the filling material 41' or the fillings 41 are etched back as far as the thin nitride liner 23. Contact openings 4', 82' which have been etched out of the filling material 41' for the bit contact structures 4 in the cell array 71 and the support contacts 82 in the support region can be seen in FIG. 17.

Figure 18:
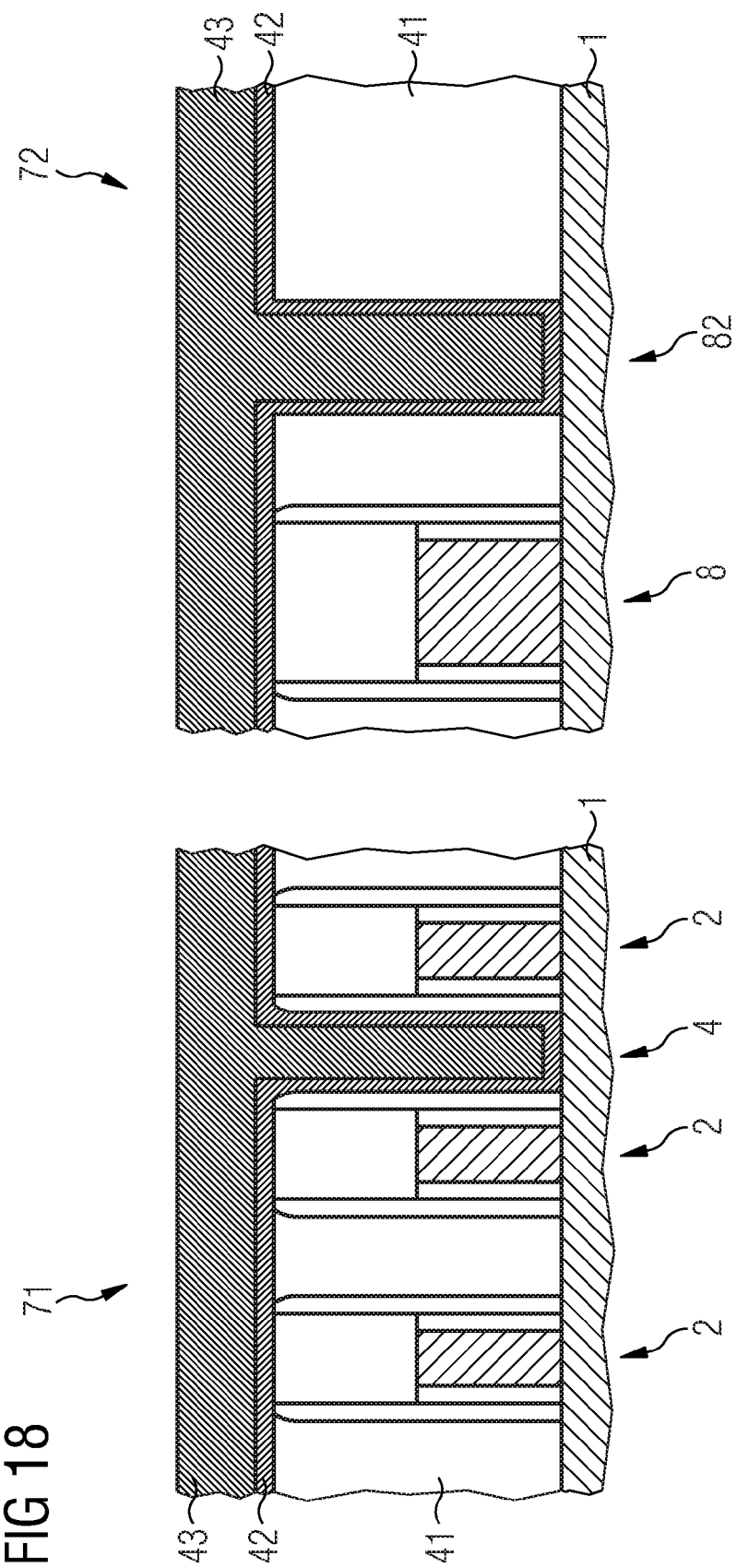
Figure 19:
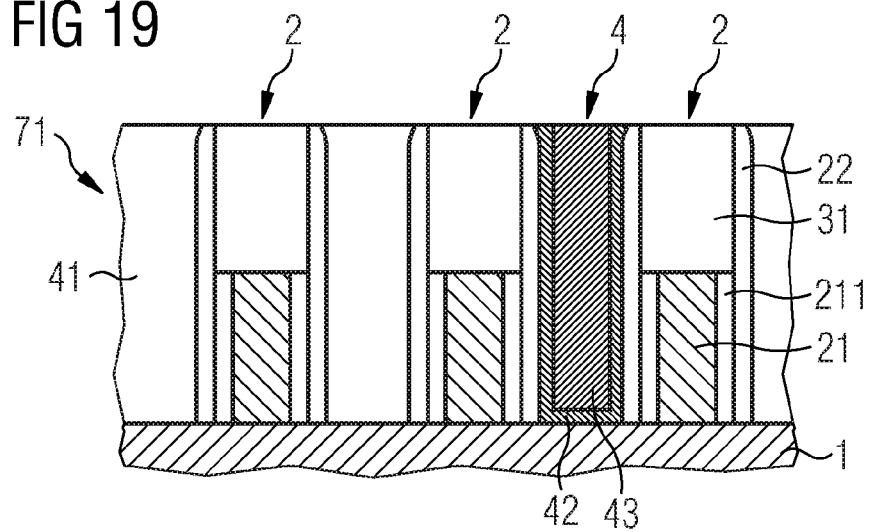

In the contact openings 4', 82', uncovered sections of the thin nitride liner 23 and any residual sections of the gate dielectric layer 11' outside the gate structures 2 are removed. An individual contact barrier layer 42 of titanium nitride and tungsten as contact metal 43 are deposited. In accordance with FIG. 18, the contact metal 43 fills the contact openings 4', 82' and forms the bit contact structures 4 and the support contacts 82. Outside the contact openings 4', 82', the contact metal 43 and the individual contact barrier layer 42 are removed by a CMP process, with the top edges of the individual gate sacrificial layers 31 once again forming a polishing stop level.

The contact metal 43 including the individual contact barrier layer 42 are caused to recede to below the top edge of the individual polysilicon layers 21, selectively with respect to silicon nitride.

Figure 20:
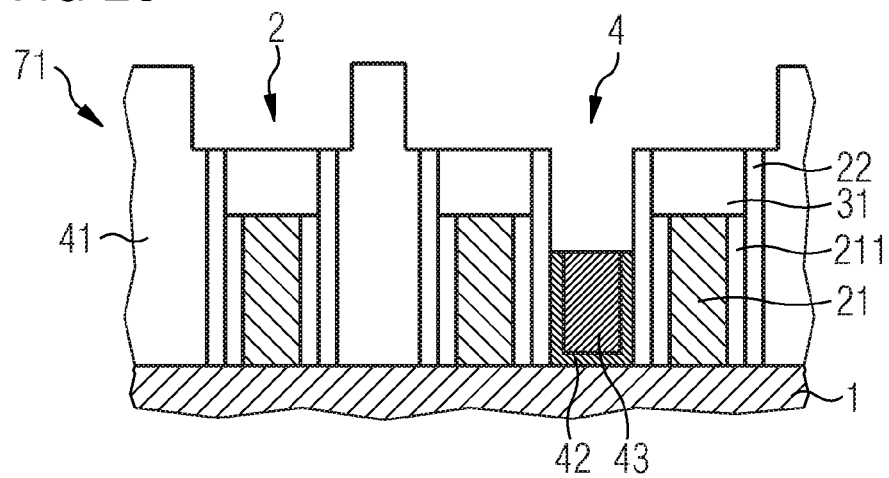

FIG. 20 illustrates a bit contact structure 4 which has been caused to recede and the top edge of which has been drawn back to below the top edge of the individual polysilicon layers 21.

At the same time or subsequently, the fillings 41 are caused to recede to below the top edge of the individual polysilicon layers 21. This forms spaces 28 between the gate structures 2, above the fillings 41 and accordingly above the contact structures 4, 82.

Figure 21:
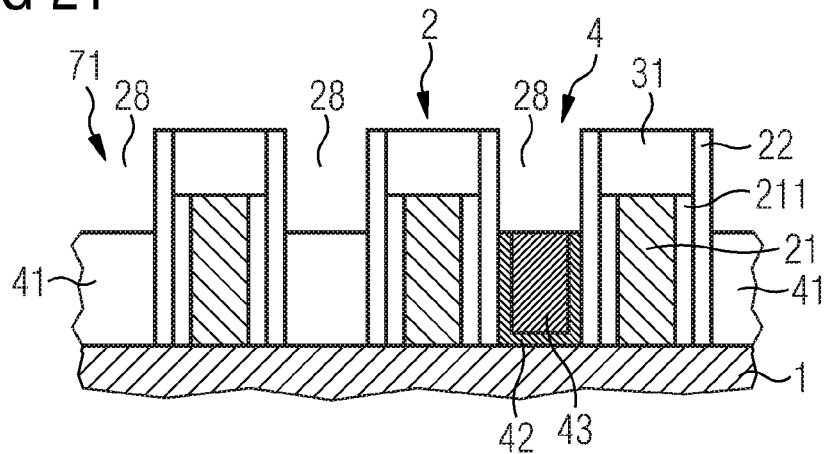

In this exemplary embodiment, the fillings 41 have been caused to recede in a corresponding way to the contact structures 4, 82, so that the top edge of the fillings 41, as illustrated in FIG. 21, approximately coincides with the top edge of the contact structures 4, 82. As the method continues, the top edges of the contact structures 4, 82 and of the fillings 41 which have been caused to recede form a common polishing stop level during the subsequent removal of a temporary contact sacrificial layer which covers the contact structures, 4, 82 during the final processing of the gate structures 2.

The top edge of the fillings 41 which have been caused to recede may also be drawn back further, to below the top edge of the bit contact structures 4 which have been caused to recede, or alternatively the fillings 41 can be removed altogether.

Figure 22:
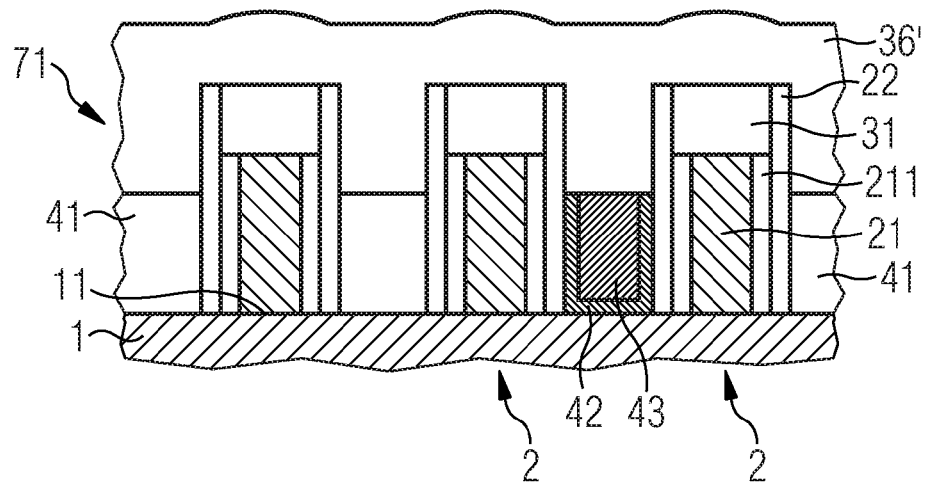

Subsequently, silicon nitride is deposited again. As illustrated in FIG. 22, the silicon nitride forms the contact sacrificial layer 36' which has already been mentioned and fills spaces between the gate structures 2 above the contact structures 4, 82 and the fillings 41 which have been caused to recede.

Then, the silicon nitride of the contact sacrificial layer 36' and the material of the gate sacrificial layer 31' are caused to recede in a planarizing CMP process which ends at the top edges of the individual polysilicon layers 21. The individual gate sacrificial layers 31 are completely removed, while the bit contact structures 4 and the support contacts 82 remain covered by residual sections 36 of the contact sacrificial layer.

Figure 23:
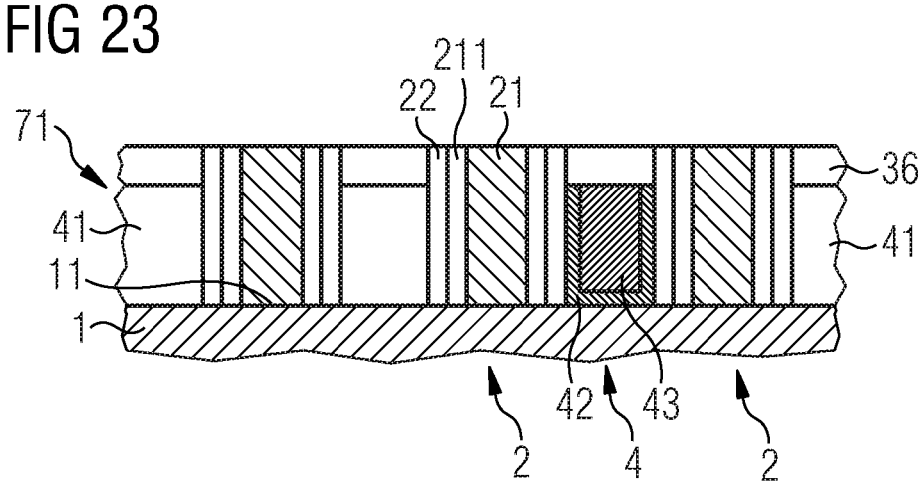

FIG. 23 illustrates the planarized structure with the uncovered individual polysilicon layers 21 and the bit contact structures 4 covered by the residual sections 36 of the contact sacrificial layer. Like the bit contact structures 4, the fillings 41 initially also remain covered by residual sections 36 of the contact sacrificial layer.

Subsequently, a process is implemented, during which the polysilicon of the individual polysilicon layers 21 and the silicon oxide of the side wall oxide structures 211 are caused to recede, either together or in succession.

Figure 24:
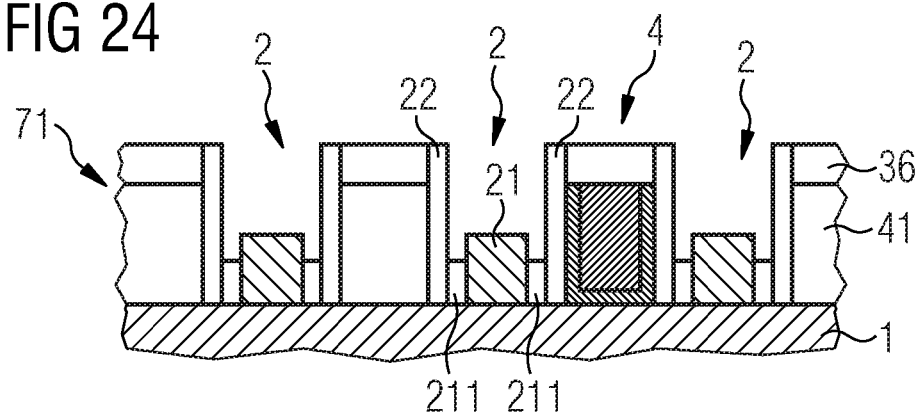

In accordance with FIG. 24, the side wall oxide structures 211 have been drawn back to below the top edge of the individual polysilicon layers 21 which have been caused to recede, with spaces 28 being formed above the individual polysilicon layers 21 between the fillings 41 and the contact structures 4.

Figure 25:
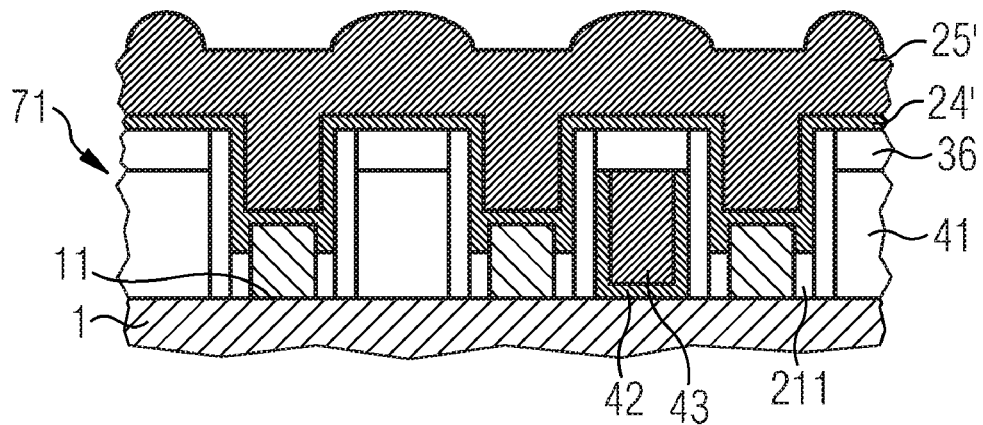
Figure 26:
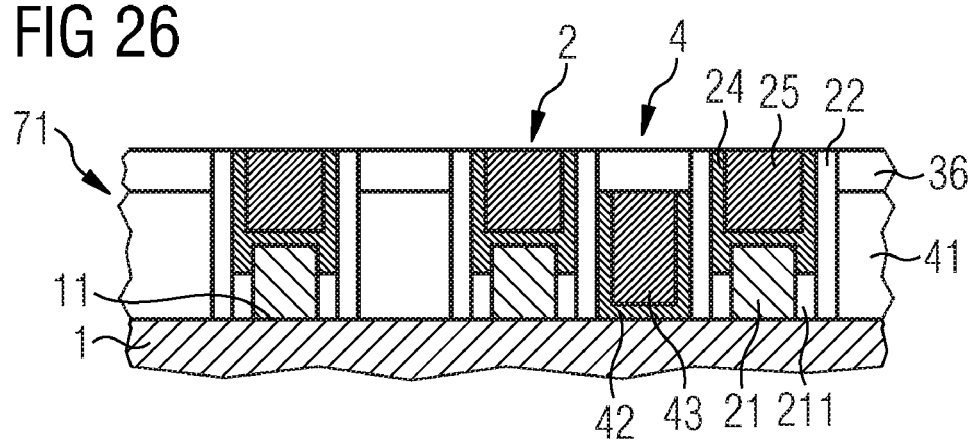

A gate barrier layer 24' of titanium and tungsten as gate metal 25' are deposited in succession, during which process, as illustrated in FIG. 25, the spaces 28 are filled. Sections of the gate barrier layer 24' and of the gate metal 25' outside the gate structures 2 are caused to recede in a planarizing CMP process. The residual sections 36 of the contact sacrificial layer form a polishing stop level for the CMP process.

Figure 27:
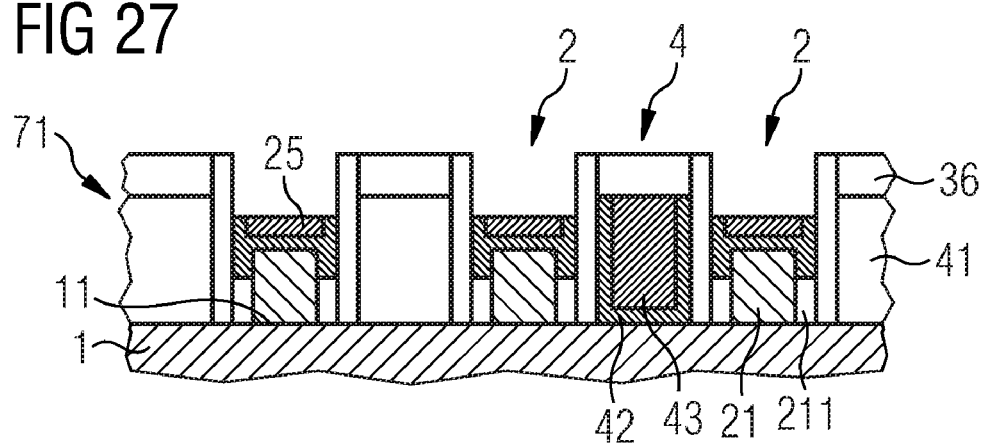

The gate metal 25' and the gate barrier layer 24' are each drawn back to below the top edge of the bit contact structures 4 by means of a recess etch. FIG. 27 illustrates the gate metal layers 25, which have been drawn back below the top edge of the bit contact structures 4 and have been formed from the gate metal 25' and the gate barrier layer 24', of the gate structures 2. The gate metal layers 25 in each case include an individual gate barrier layer 24 formed from the gate barrier layer 24'.

Figure 28:
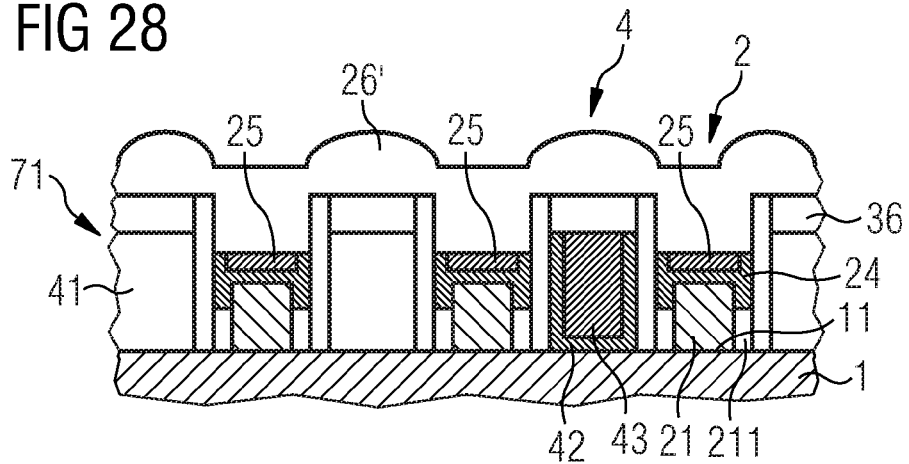
Figure 29:
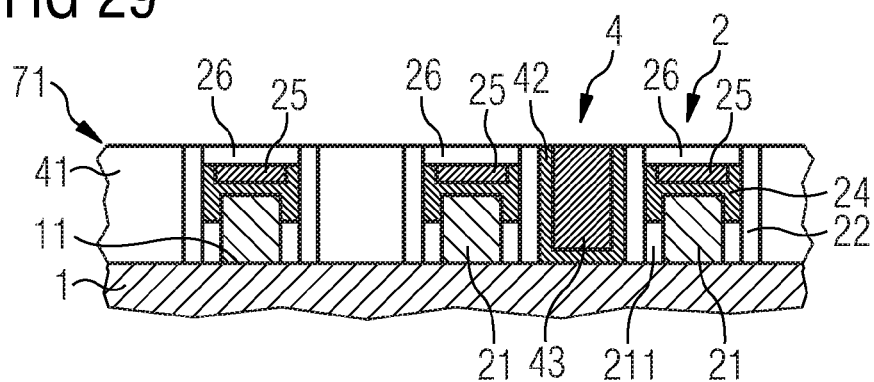

Silicon nitride is deposited once again, forming a gate cap layer 26' in accordance with FIG. 28. In a further CMP process, the results of which are illustrated in FIG. 29, the gate cap layer 26' is caused to recede to below the top edge of the bit contact structures 4. The top edge of the bit contact structures 4, in combination with the correspondingly aligned top edge of the fillings 41 of BPSG which have been caused to recede, forms a polishing stop level for this polishing process.

Figure 30:
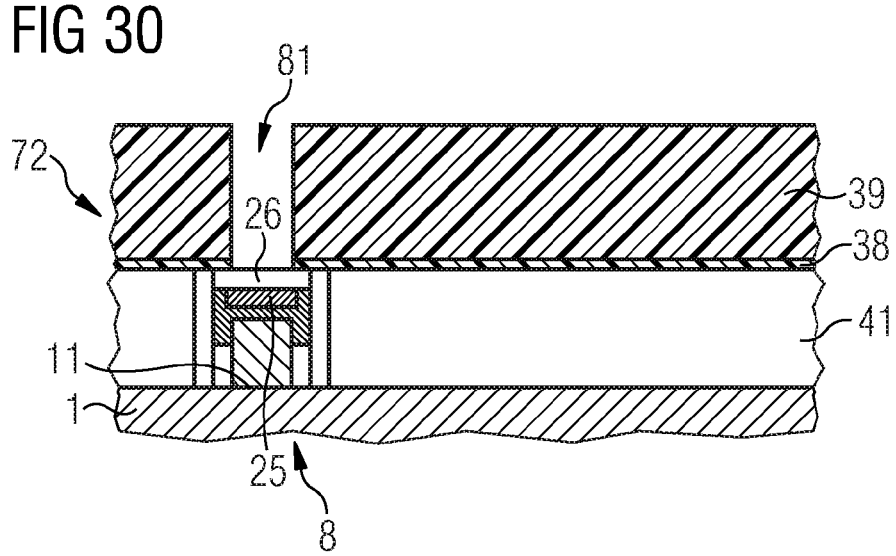

In accordance with FIG. 30, a further photolithographic patterning process is carried out by means of a CG antireflection coating 38 and a CG photoresist layer 39; during this further photolithographic patterning process, the CG photoresist layer 39 is opened up in the support region 72 above the support gate stacks 8.

The gate caps 26 are opened up below the openings in the CG photoresist layer 39, so as to uncover the individual gate metal layers 25 of the support gate stacks 8.

Figure 31:
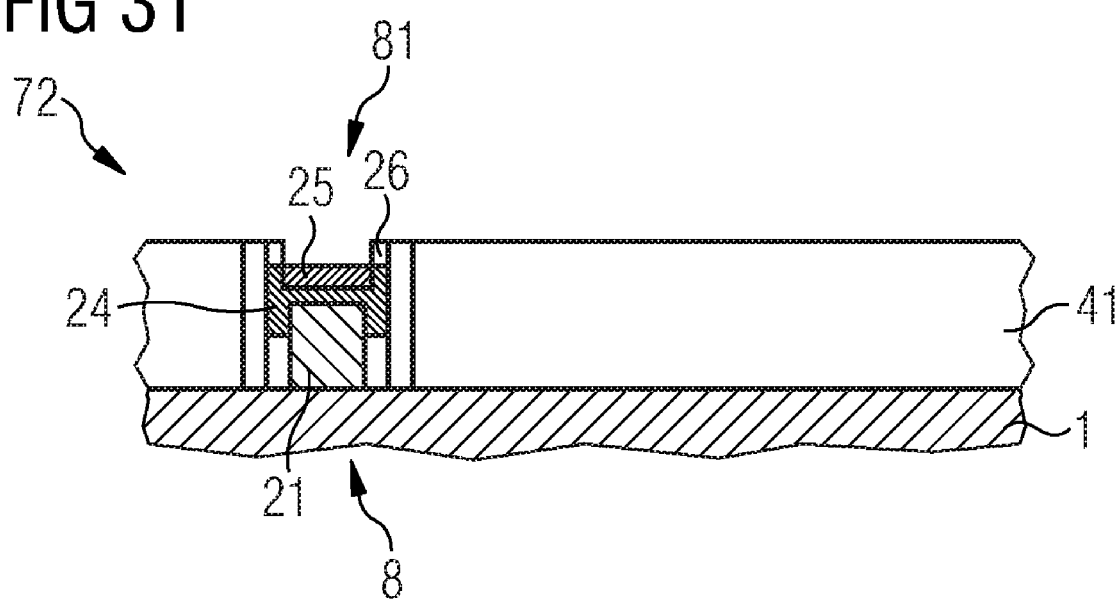

FIG. 31 illustrates the uncovered individual gate metal layer 25 of a support gate stack 8 in the support region 72 following removal of the CG antireflection coating 38 and of the CG photoresist layer 39.

Figure 32:
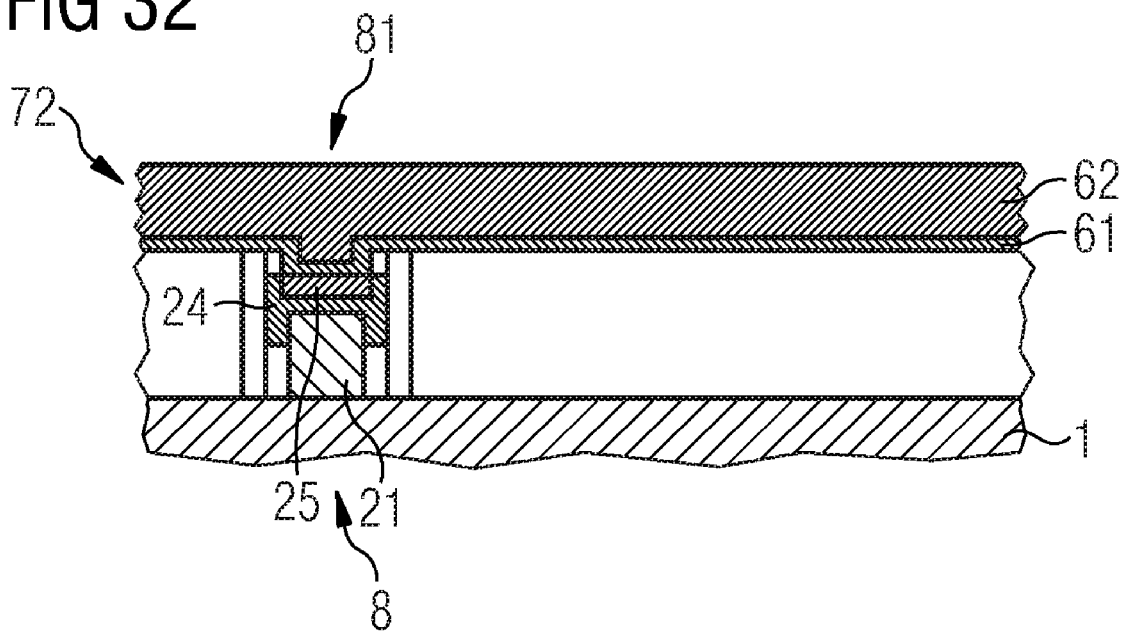

An interconnect barrier layer 61 of titanium nitride and tungsten as interconnect metal 62 are deposited, resulting in the support gate stack 82 illustrated in FIG. 32 in the support region 72.

Figure 33:
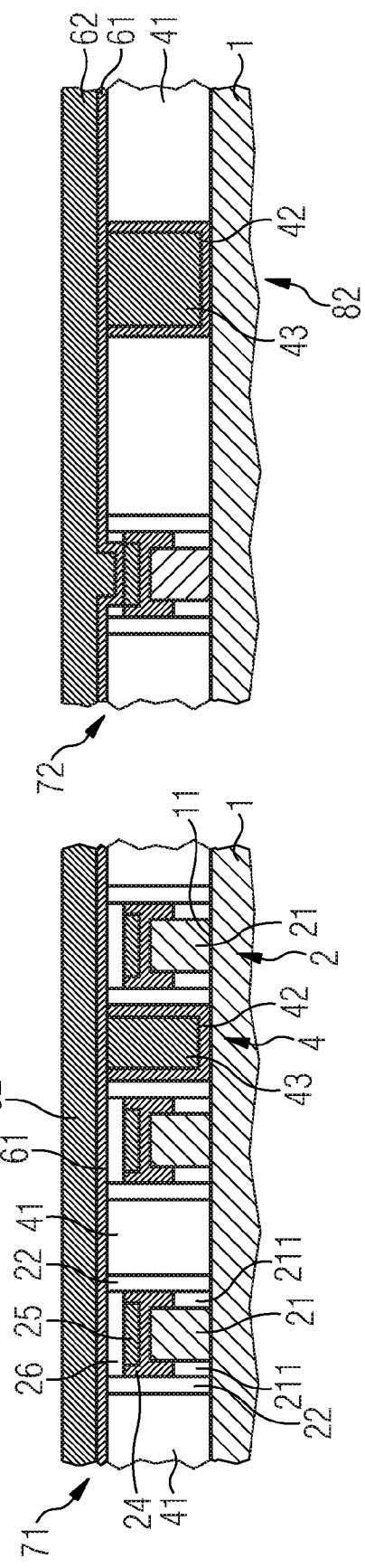

FIG. 33 illustrates bit contact structures 4 and support contacts 82 as well as gate electrode structures 2 and support gate stacks 8 which have been formed in the cell array 71 and the support region 72, respectively, using the method according to one embodiment of the invention.

Gate electrode structures 2 are located on a semiconductor substrate 1, in each case spaced apart from the semiconductor substrate 1 by a gate dielectric 11. The gate electrode structures 2 each comprise an individual polysilicon layer 21, with side wall oxide structures 211 formed on its vertical side walls in a lower section and covered in an upper section by the material of an individual gate barrier layer 24. An individual gate metal layer 25 includes an individual gate barrier layer 24 located on the underlying individual polysilicon layer 21. Furthermore, the individual gate barrier layer 24 is provided along nitride spacers 22 which cover the vertical side walls of the gate electrode structure 2. A dielectric gate cap 26 is located on the gate metal layer 25.

The gate caps 26 of the support gate stacks 8 in the support region 72 have been opened up. A section of the interconnect barrier layer 61 is embedded between the interconnect metal 62 and the gate metal layer 25.

In the cell array 71, both homogeneous BPSG fillings 41 and bit contact structures 4 are formed between each pair of gate electrode structures 2. The bit contact structures 4 each comprise a conformal contact barrier layer 42 and a filling of the contact metal 43. A section of the interconnect barrier layer 61 is formed between the contact metal 43 and an interconnect metal 62, which forms a connecting structure for connecting the respective bit contact structure to other parts of the circuit, for example a bit line or data line. The same applies to support contact 82 in the support region 72.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a transistor that comprises a gate electrode, the gate electrode comprising:
    a polysilicon layer in contact with a gate dielectric layer separating the gate electrode and a semiconductor substrate that comprises an active region of the transistor;
    sidewall structures extending along lower portions of opposing sidewalls of the polysilicon layer, the lower portion being oriented to the semiconductor substrate; and
    a barrier layer, wherein a first section of the barrier layer extends along an upper portion of the sidewall of the polysilicon layer, the upper portion being adjacent to the lower portion and facing away from the semiconductor substrate.

2. The integrated circuit of claim 1, wherein the barrier layer contains a metal.

3. The integrated circuit of claim 1, wherein the barrier layer comprises titanium.

4. The integrated circuit of claim 1, wherein the barrier layer comprises a second section that extends along an upper portion of a second sidewall of the polysilicon layer, wherein the second section faces the first section at the polysilicon layer.

5. The integrated circuit of claim 1, wherein the barrier layer comprises a third section covering an upper surface of the polysilicon layer.

6. The integrated circuit of claim 5, the gate electrode further comprising:
    a metal layer disposed on the barrier layer.

7. The integrated circuit of claim 6, wherein the metal layer comprises tungsten.

8. The integrated circuit of claim 6, wherein the barrier layer comprises further sections extending along the sidewalls of the metal layer.

9. The integrated circuit of claim 6, further comprising:
    a connection line including:
        an interconnect barrier layer that is disposed on and in contact with the metal layer; and
        an interconnect metal layer disposed on the interconnect barrier layer.

10. The integrated circuit of claim 9, wherein the interconnect barrier layer comprises a metal.

11. The integrated circuit of claim 10, wherein the interconnect barrier layer comprises titanium.

12. The integrated circuit of claim 10, wherein the interconnect metal layer comprises tungsten.

13. The integrated circuit of claim 1, wherein the sidewall structures are thermally grown silicon oxide structures.

14. The integrated circuit of claim 1, further comprising:
a contact structure disposed in contact with a source/drain region of a transistor formed in the semiconductor substrate, the contact structure comprising:
a contact barrier layer in contact with the source/drain region; and
a contact metal layer disposed on and in contact with the contact barrier layer; and
a connection line comprising:
an interconnect barrier layer that is disposed on and in contact with the contact metal layer and
an interconnect metal layer disposed on the interconnect barrier layer.

15. An intermediate structure comprising:
a polysilicon structure in contact with a gate dielectric layer separating the polysilicon structure and a semiconductor substrate;
sidewall structures extending along a lower portion of opposing sidewalls of the polysilicon layer, the lower portion being oriented to the semiconductor substrate;
a contact structure disposed in contact with the semiconductor substrate, the contact structure comprising:
a contact barrier layer in contact with a contact area of the semiconductor substrate;
a contact metal layer disposed on and in contact with the contact barrier layer; and
a dielectric cap disposed on and in contact with the contact metal layer and facing the contact area.

16. The intermediate structure of claim 15, further comprising:
a dielectric spacer separating the contact structure and one of the sidewall structures.

17. The intermediate structure of claim 15, wherein the sidewall structures are thermally grown silicon oxide structures.

18. A semiconductor component comprising:
a semiconductor substrate;
a gate dielectric layer adjacent the semiconductor substrate;
a polysilicon layer in contact with the gate dielectric layer, the polysilicon layer having opposing sidewalls with lower portions oriented to the semiconductor substrate and upper portions facing away from the semiconductor substrate;
sidewall structures extending along the lower portions of the opposing sidewalls of the polysilicon layer; and
a barrier layer having at least a first section extending along the upper portion of one of the opposing sidewalls of the polysilicon layer.

19. The semiconductor component of claim 18 configured a gate electrode of a transistor.

20. The integrated circuit of claim 18, wherein the barrier layer further comprises a second section that extends along the upper portion of the other of the opposing sidewalls of the polysilicon layer, wherein the second section faces the first section at the polysilicon layer.

* * * * *